US008697490B2

(12) United States Patent
Pendse

(10) Patent No.: US 8,697,490 B2
(45) Date of Patent: Apr. 15, 2014

(54) FLIP CHIP INTERCONNECTION STRUCTURE

(75) Inventor: Rajendra D. Pendse, Fremont, CA (US)

(73) Assignee: STATS ChipPAC, Ltd., Singapore (SG)

(*) Notice: Subject to any disclaimer, the term of this patent is extended or adjusted under 35 U.S.C. 154(b) by 0 days.

(21) Appl. No.: 13/175,694

(22) Filed: Jul. 1, 2011

(65) Prior Publication Data

US 2011/0260321 A1  Oct. 27, 2011

Related U.S. Application Data

(60) Continuation of application No. 10/849,947, filed on May 20, 2004, now Pat. No. 7,994,636, which is a division of application No. 09/802,664, filed on Mar. 9, 2001, now Pat. No. 6,815,252.

(60) Provisional application No. 60/188,570, filed on Mar. 10, 2000.

(51) Int. Cl.
*H01L 21/44* (2006.01)
*H01L 21/30* (2006.01)

(52) U.S. Cl.
USPC ............. 438/107; 428/209; 438/17; 438/614; 257/248; 257/710; 257/704; 257/784; 257/254; 257/415; 257/E23.045

(58) Field of Classification Search
USPC ................ 257/780, 781, E21.503, E21.511, 257/E23.012, E23.067, E23.069, E23.078, 257/710, 704, 248, 784; 228/180.22
See application file for complete search history.

(56) References Cited

U.S. PATENT DOCUMENTS

| | | | | |
|---|---|---|---|---|
| 3,665,590 A | * | 5/1972 | Percival | 228/180.21 |
| 4,208,005 A | | 6/1980 | Nate et al. | |
| 5,210,938 A | | 5/1993 | Hirai | |
| 5,219,117 A | * | 6/1993 | Lin | 228/253 |
| 5,250,469 A | * | 10/1993 | Tanaka et al. | 29/840 |
| 5,346,857 A | | 9/1994 | Scharr et al. | |

(Continued)

FOREIGN PATENT DOCUMENTS

EP  0352020 A2  1/1990
JP  01226160  9/1989

(Continued)

OTHER PUBLICATIONS

Yamada, Hiroshi et al., "Advanced copper column based solder bump for flip-chip interconnection", International Symposium on Microelectronics, 1997, pp. 417-422, The British Library—"The world's knowledge".

(Continued)

*Primary Examiner* — Zandra Smith
*Assistant Examiner* — Tsz Chiu
(74) *Attorney, Agent, or Firm* — Robert D. Atkins; Patent Law Group: Atkins & Associates, P.C.

(57) ABSTRACT

A flip chip interconnection structure is formed by mechanically interlocking joining surfaces of a first and second element. The first element, which may be a bump on an integrated circuit chip, includes a soft, deformable material with a low yield strength and high elongation to failure. The surface of the second element, which may for example be a substrate pad, is provided with asperities into which the first element deforms plastically under pressure to form the mechanical interlock.

26 Claims, 3 Drawing Sheets

(56) References Cited

U.S. PATENT DOCUMENTS

| | | | |
|---|---|---|---|
| 5,378,859 A | | 1/1995 | Shirasaki et al. |
| 5,386,624 A | * | 2/1995 | George et al. .................... 29/832 |
| 5,434,410 A | | 7/1995 | Kulwicki |
| 5,508,561 A | | 4/1996 | Tago et al. |
| 5,519,580 A | | 5/1996 | Natarajan et al. |
| 5,592,736 A | | 1/1997 | Akram et al. |
| 5,634,267 A | | 6/1997 | Farnworth et al. |
| 5,650,595 A | | 7/1997 | Bentlage et al. |
| 5,686,317 A | | 11/1997 | Akram et al. |
| 5,710,071 A | | 1/1998 | Beddingfield et al. |
| 5,714,252 A | | 2/1998 | Hogerton et al. |
| 5,717,477 A | | 2/1998 | Fritz et al. |
| 5,801,350 A | * | 9/1998 | Shibuya et al. .......... 204/157.15 |
| 5,802,699 A | | 9/1998 | Fjelstad et al. |
| 5,829,126 A | | 11/1998 | Nagao et al. |
| 5,844,782 A | | 12/1998 | Fukasawa |
| 5,865,365 A | | 2/1999 | Nishikawa et al. |
| 5,869,886 A | | 2/1999 | Tokuno |
| 5,869,904 A | * | 2/1999 | Shoji .............................. 257/779 |
| 5,872,051 A | * | 2/1999 | Fallon et al. .................... 438/616 |
| 5,872,399 A | | 2/1999 | Lee |
| 5,874,780 A | | 2/1999 | Murakami |
| 5,889,326 A | | 3/1999 | Tanaka |
| 5,892,289 A | | 4/1999 | Tokuno |
| 5,915,169 A | | 6/1999 | Heo |
| 5,931,371 A | * | 8/1999 | Pao et al. .................. 228/180.22 |
| 5,940,729 A | | 8/1999 | Downes, Jr. et al. |
| 5,953,814 A | | 9/1999 | Sozansky et al. |
| 5,985,456 A | | 11/1999 | Zhou et al. |
| 6,037,192 A | | 3/2000 | Witzman et al. |
| 6,037,707 A | * | 3/2000 | Gailus et al. .................. 310/363 |
| 6,100,597 A | * | 8/2000 | Nakamura .................... 257/787 |
| 6,121,143 A | | 9/2000 | Messner et al. |
| 6,130,476 A | | 10/2000 | LaFontaine, Jr. et al. |
| 6,153,940 A | | 11/2000 | Zakel et al. |
| 6,173,887 B1 | | 1/2001 | Mead et al. |
| 6,194,781 B1 | | 2/2001 | Ikegami |
| 6,201,305 B1 | | 3/2001 | Darveaux et al. |
| 6,214,642 B1 | | 4/2001 | Chen et al. |
| 6,218,630 B1 | | 4/2001 | Takigami |
| 6,225,144 B1 | | 5/2001 | How et al. |
| 6,228,466 B1 | | 5/2001 | Tsukada et al. |
| 6,259,163 B1 | | 7/2001 | Ohuchi et al. |
| 6,281,450 B1 | | 8/2001 | Urasaki et al. |
| 6,297,560 B1 | | 10/2001 | Capote et al. |
| 6,324,754 B1 | | 12/2001 | DiStefano et al. |
| 6,326,234 B1 | | 12/2001 | Nakamura |
| 6,329,605 B1 | | 12/2001 | Beroz et al. |
| 6,335,568 B1 | | 1/2002 | Yuzawa et al. |
| 6,335,571 B1 | * | 1/2002 | Capote et al. .................. 257/787 |
| 6,337,522 B1 | | 1/2002 | Kang et al. |
| 6,396,707 B1 | | 5/2002 | Huang et al. |
| 6,426,636 B1 | * | 7/2002 | Das et al. .................. 324/754.07 |
| 6,441,316 B1 | | 8/2002 | Kusui |
| 6,448,665 B1 | | 9/2002 | Nakasawa et al. |
| 6,483,195 B1 | * | 11/2002 | Aoki et al. .................... 257/778 |
| 6,573,610 B1 | | 6/2003 | Tsai |
| 6,600,234 B2 | | 7/2003 | Kuwabara et al. |
| 6,608,388 B2 | | 8/2003 | Lin et al. |
| 6,710,458 B2 | | 3/2004 | Seko |
| 6,818,545 B2 | | 11/2004 | Lee et al. |
| 6,822,336 B2 | * | 11/2004 | Kurita ............................ 257/780 |
| 6,893,901 B2 | * | 5/2005 | Madrid .......................... 438/122 |
| 7,576,427 B2 | | 8/2009 | Potter |
| 7,758,351 B2 | | 7/2010 | Brown et al. |
| 2001/0026010 A1 | * | 10/2001 | Horiuchi et al. .............. 257/678 |
| 2003/0001253 A1 | * | 1/2003 | Kurita ............................ 257/688 |

FOREIGN PATENT DOCUMENTS

| | | |
|---|---|---|
| JP | 02067742 | 7/1990 |
| JP | 03006828 | 1/1991 |
| JP | 04-355933 | 9/1992 |
| JP | 07086346 | 3/1995 |
| JP | 07115097 | 5/1995 |
| JP | 07142488 | 6/1995 |
| JP | 07201917 | 8/1995 |
| JP | 07283268 | 10/1995 |
| JP | 09097816 | 8/1997 |
| JP | 09275125 | 10/1997 |
| JP | 10050765 | 2/1998 |
| JP | 10-256309 | 9/1998 |
| JP | 11186324 | 7/1999 |
| JP | 11204913 | 7/1999 |
| JP | 2000-031204 | 1/2000 |
| JP | 2004-221205 | 5/2004 |

OTHER PUBLICATIONS

Yamada, Hiroshi et al., "A fine pitch and high aspect ratio bump array for flip-chip interconnection", Int'l Electronics Manufacturing Technology Symposium, 1992, pp. 288-292, IEEE/CHMT.

Kawahara, Toshimi, "SuperCSP", IEEE Transactions on Advanced Packaging, May 2000, pp. 215-219, vol. 23, No. 2.

* cited by examiner

US 8,697,490 B2

FLIP CHIP INTERCONNECTION STRUCTURE

CLAIM OF DOMESTIC PRIORITY

The present application is a continuation of U.S. patent application No. 10/849,947, filed May 20, 2004, now U.S. Pat. No. 7,994,636, which is a division of U. S. patent application, 09/802,664, filed Mar. 9, 2001, now U.S. Pat. No. 6,815,252, which claims the benefit of U.S. Provisional Application No. 60/188,570, filed Mar. 10, 2000.

FIELD OF THE INVENTION

This invention relates to flip chip interconnection structures and, more particularly, to an interconnect structure formed by mechanical deformation and interlocking of asperities between the surfaces to be joined.

BACKGROUND OF THE INVENTION

Flip chip interconnection between an integrated circuit (IC) chip and a substrate is commonly performed in electronic package assembly. In the most common form of such interconnection bumps on the IC chip are metallurgically joined to pads formed on the substrate, usually by melting of the bump material. While this approach provides robust connections, it is difficult to reduce the pitch of the interconnection due to the risk of bridging (i.e., shorting between adjacent connections) during the melting and solidification processes. In an alternative approach the attachment is made using a particulate film or paste, whereby conductive particles in the paste or film together with the shrinkage force of a resin effect an electrical connection. This approach lends itself to reduction of interconnection pitch but suffers from limited long term reliability owing to the susceptibility of the particulate interconnection to degrade over time.

SUMMARY OF THE INVENTION

In one general aspect the invention features a method for forming a flip chip interconnection structure, by providing a first member on an IC chip and a second member on a substrate, in which the first member includes a deformable material having a low yield strength and a high elongation to failure and the second member has surface asperities on the part to be bonded with the first member; and pressing the first and second members against one another using a force sufficient to cause plastic flow of part of the first member into asperities on the second member.

In some embodiments the first member is a bump formed on the IC chip, and typically is one of a set of such bumps; and the deformable materials of the first member in some particularly useful embodiments includes gold. In some embodiments the second member is a lead or pad on the substrate, or is a via opening. In some embodiments the second member is a surface pad having a conventional plated surface finish, on which the asperities are provided according to the invention.

In another general aspect the invention features a flip chip interconnection structure made by the method of the invention.

In another general aspect the invention features a flip chip interconnection structure, which includes a first member attached to a chip and a second member attached to a substrate, in which the first member is of a deformable material and the first and second members are bonded by mechanical interlocking of the deformable material of the first member with asperities on the surface of the second member.

DETAILED DESCRIPTION OF THE DRAWINGS

Figure 1A:
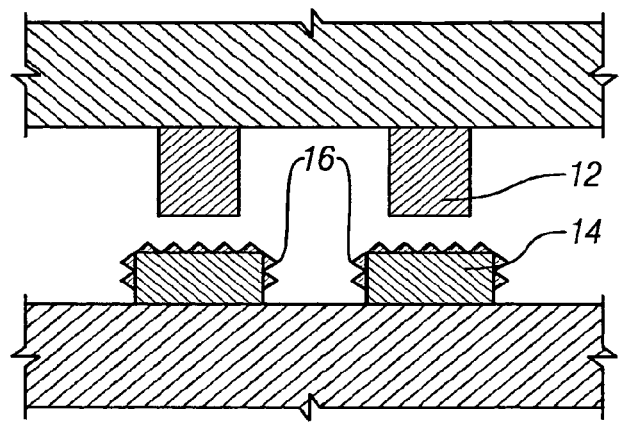
FIGS. 1A, 1B are diagrammatic sketches in a sectional view showing an illustrative embodiment according to the invention of steps in the formation of an assembly having a chip interconnection structure according to the invention.
Figure 1B:
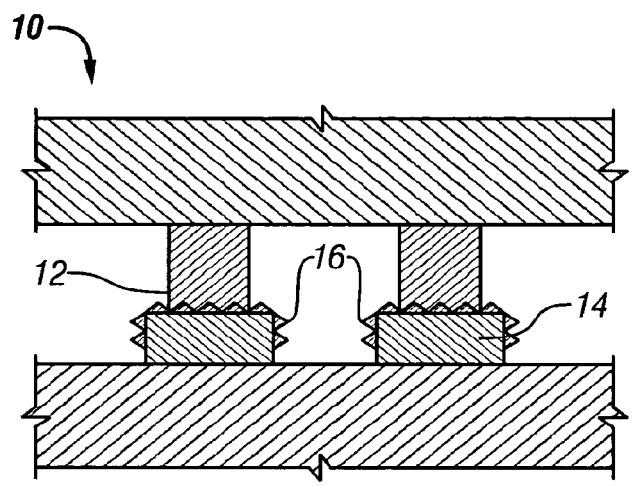

With reference to FIGS. 1A, 1B a flip chip interconnection structure generally designated 10 is shown schematically including a first member 12 and a second member 14. The first member 12 is preferably a bump formed on the IC chip and the second member 14 is preferably a lead or pad formed on the substrate. The first member 12 further preferably comprises a soft, deformable material with a low yield strength and high elongation to failure. The second member 14 further preferably includes a substrate pad with a conventional plated surface finish, and is characterized by having asperities 16, which are shown exaggerated in the Figs. for purposes of illustration. The scale of the asperities is generally in the order about 1 µm-25 µm. The bump is a generally compliant material, that is to say, a material that, in the particular bump as shaped, undergoes a plastic deformation greater than about 25 µm under a force equivalent to a vertical load of about 250 grams. Gold can be a particularly useful material for the bumps according to the invention.

The interconnection is accomplished by compressing the first member 12 and the second member 14 against one another to cause plastic flow of first member 12 into asperities 16. The height and soft nature of first member 12 allows considerable deformation to occur even after the connection is effected thus allowing for other bump/pad pairs with poor planarity to be joined with equal success. The force and temperature requirements necessary to effect the interconnection are significantly lower than needed for conventional thermo-compression bonds that require metallurgical diffusion of the mating materials. These reduced requirements greatly reduce damage that might otherwise occur on the chip, particularly when the number of connections to be effected simultaneously is large.

Figure 2A:
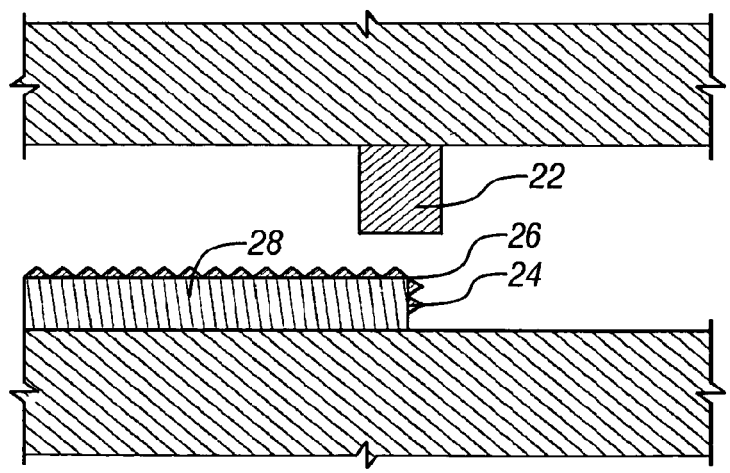
FIGS. 2A, 2B are diagrammatic sketches in a sectional view showing a second illustrative embodiment according to the invention of steps in the formation of an assembly having a chip interconnection structure according to the invention.
Figure 2B:
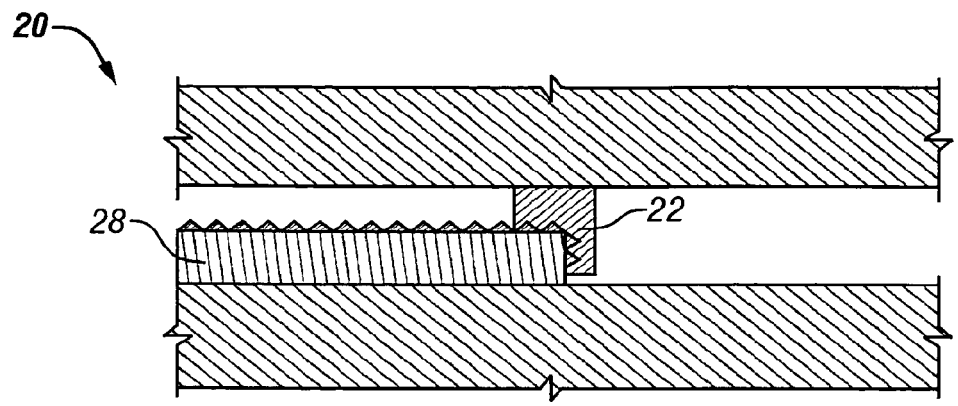

A second embodiment is schematically shown in FIGS. 2A, 2B. A macroscopic interlocking configuration generally designated 20 is formed by plastic flow of the material of first member 22 around a side wall 24 and edge 26 of a second member or trace 28. Preferably the flow of the material of first member 22 is around the side wall 24 and does not cause material flow into a region between adjacent traces but rather in the normal direction within the same plane. The interlocking configuration 20 provides for an increased area of interlocked surfaces without significantly increasing the bonding force, thereby providing a more robust connection. Further the additional displacement perpendicular to the chip surface provides greater tolerance to poor co-planarity of multiple mating surface. Finally, the interlocking along a plane perpendicular to the chip surface in addition to the usual interlocking parallel to the chip surface provides for protection against relative movement between the die and the substrate in a perpendicular direction.

Figure 3A:
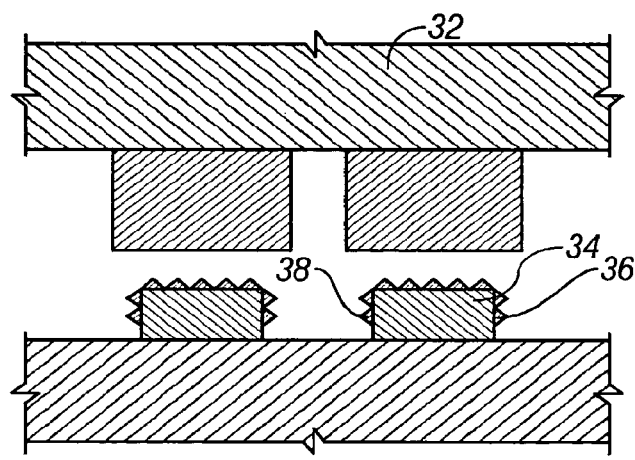
FIGS. 3A, 3B are diagrammatic sketches in a sectional view showing a third illustrative embodiment according to the invention of steps in the formation of an assembly having a chip interconnection structure according to the invention.
Figure 3B:
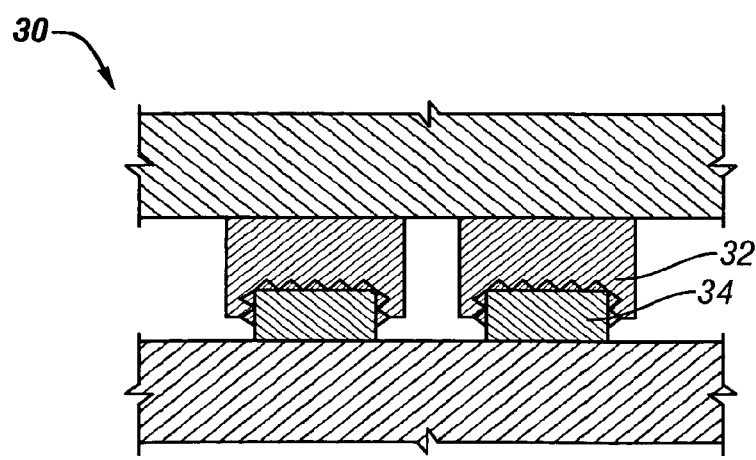

A third embodiment is shown in FIGS. 3A, 3B and includes an interconnection generally designated 30. The interconnection 30 is formed by plastic flow of the material of a first member 32 around a second member 34. The second member 34 includes a smaller width than that of the first member 32 which allows for plastic flow of the material of first member 32 around both sides 36 and 38 of the second member 34.

Figure 4A:
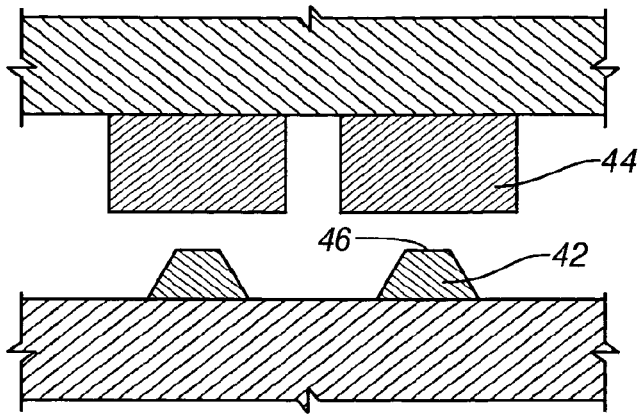
FIGS. 4A, 4B are diagrammatic sketches in a sectional view showing a fourth illustrative embodiment according to the invention steps in the formation of an assembly having a chip interconnection structure according to the invention.
Figure 4B:
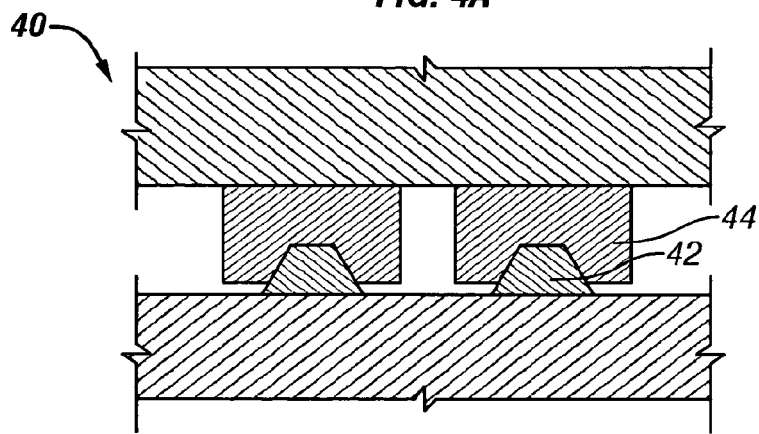

A fourth embodiment is shown in FIGS. 4A, 4B and includes an interconnection generally designated 40. The lead geometry of a second element 42 is shown to be wedge shaped to take advantage of what represents the most typical "undercut" lead shape in actual substrates that are fabricated by the subtractive etching method. The interconnection 40 is formed by plastic flow of the material of a first element 44 around the second element 42. The shown geometry removes the restriction of minimum trace width and more specifically the minimum width of a plateau 46 necessary for conventional wire bonding applications. It is contemplated that the interconnection 40 could alternatively be formed by bonding directly on a via pad or through a via hole down to the next lower layer on the substrate.

In embodiments as described above with reference to FIGS. 2A, 2B, 3A, 3B, 4A, 4B, the macroscopic interlocking configuration allows for formation of the interconnect using a lower force, for example lower by a factor of 2, as compared with embodiments as described above with reference to FIGS. 1A, 1B. Use of lower force of compression can result in less damage to chips during processing.

In preferred embodiments, an adhesive resin is preferably applied in a space between the chip and the substrate such that the compressive force supplied by the cured resin further improves the long-term retention of the electrical connection. The adhesive resin is preferably applied before the mating surfaces are bonded, and is cured concomitantly with the formation of the interconnection. The applied interconnection force helps displace the resin material away from the mating surfaces to allow the formation of the desired mechanically interlocked connection. Alternatively, the resin can be applied after the interconnection using an underfill process.

In the disclosed preferred embodiments, the material of the first members 12, 22, 32 and 44 is preferably Cu, electroless NiAu or Au. The substrate material is preferably single-sided FR5 laminate or 2-sided BT-resin laminate.

Figure 5:
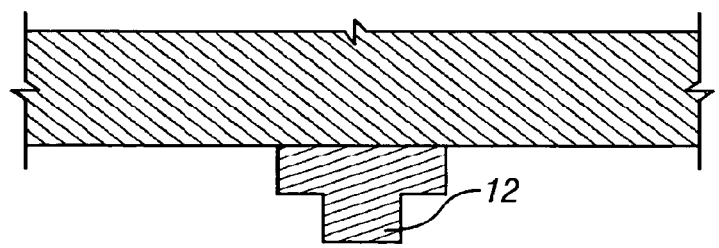
FIG. 5 is a diagrammatic sketch in a sectional view showing an alternative shape for an interconnection bump useful according to the invention.
Figure 6:
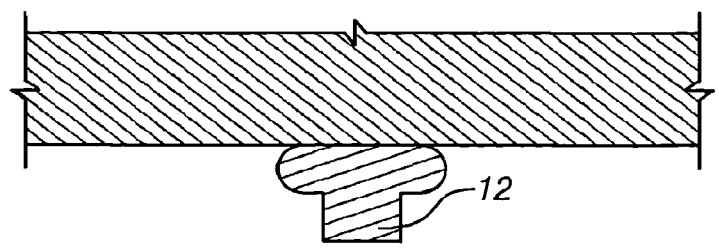
FIG. 6 is a diagrammatic sketch in a sectional view showing another alternative shape for an interconnection bump useful according to the invention.

The bumps may have various configurations other than one shown in the Figs. above having a generally rectangular section before compression and deformation; two particularly useful ones are shown diagrammatically in FIGS. 5 and 6. FIG. 5 shows a "stepped" shape, in which the portion of the bump adjacent the chip (the "base") is wider than the portion (the "tip") that will be compressed against the pad on the substrate. FIG. 6 shows a "stud bump" configuration, in which the base has a peripherally rounded profile that is wider than the tip. Either of these constructs can provide improved compliance of the bump with the asperities on the substrate, owing to the thinner tip dimension, and also provide good structural stability owing to the wider profile of the base.

The second member may be a lead or a pad, as described above, and a bump may be interconnected to a conventional solder pad that is electrically connect to a via hole; but in some embodiments the second member itself includes a via hole. According to this embodiment of the invention an interconnection structure can be formed directly between the bump and the via hole, by compressing the bump directly against conductive material in and at the margin of the via hole, rather than compressing the bump onto a pad, such as a solder pad, formed at some distance away from the via hole and connected to it. This results in a more efficient use of the area on the chip. Where the opening in the via hole is generally smaller than the tip of the bump, then the bump can be pressed directly onto the via hole, and becomes deformed into the via hole to form the interconnection; in effect, the via hole works as the asperity in this construct where the bump is smaller than the via hole, then the bump can be offset, so that the bond is formed at a portion of the rim of the via opening.

What is claimed:

1. A method of making a semiconductor device, comprising:
    providing a semiconductor die;
    forming a plurality of copper bumps including substantially linear sidewalls over a surface of the semiconductor die;
    providing a substrate;
    forming a plurality of interconnect pads over a surface of the substrate; and
    bonding the copper bumps to a surface of the interconnect pads by plastic deformation of the copper bumps into the surface of the interconnect pads while maintaining the substantially linear sidewalls of the copper bumps for vertical separation between the semiconductor die and substrate.

2. The method of claim 1, wherein the plastic deformation of the copper bumps into the surface of the interconnect pads provides displacement of the copper bumps perpendicular to the surface of the semiconductor die while maintaining the vertical separation between the semiconductor die and substrate.

3. The method of claim 1, further including deforming the copper bumps into the surface of the interconnect pads to reduce relative movement between the semiconductor die and substrate.

4. The method of claim 1, wherein the plastic deformation occurs along a sidewall of the copper bumps.

5. The method of claim 1, further including forming a width of the interconnect pads to be less than a width of the copper bumps.

6. The method of claim 1, further including depositing an adhesive resin between the semiconductor die and substrate.

7. A method of making a semiconductor device, comprising:
    providing a semiconductor die;
    forming a bump including a substantially linear sidewall over a surface of the semiconductor die;
    providing a substrate;
    forming an interconnect pad over a surface of the substrate; and
    bonding the bump to a surface of the interconnect pad by plastic deformation of the bump into the surface of the interconnect pad while maintaining the substantially linear sidewall of the bump for vertical separation between the semiconductor die and substrate.

8. The method of claim 7, wherein the plastic deformation of the bump into the surface of the interconnect pad provides displacement of the bump perpendicular to the surface of the semiconductor die while maintaining the vertical separation between the semiconductor die and substrate.

9. The method of claim 7, further including deforming the bump into the surface of the interconnect pad to reduce relative movement between the semiconductor die and substrate.

10. The method of claim 7, further including forming the bump of gold, copper, or nickel.

11. The method of claim 7, wherein the bump undergoes plastic deformation of about 25 micrometers.

12. The method of claim 7, further including forming a width of the interconnect pad to be less than a width of the bump.

13. The method of claim 7, further including depositing an adhesive resin between the semiconductor die and substrate.

14. A method of making a semiconductor device, comprising:
 providing a semiconductor die;
 forming a bump over the semiconductor die;
 providing a substrate;
 forming an interconnect pad over the substrate; and
 bonding the bump to the interconnect pad by plastic deformation of the bump into the interconnect pad while maintaining vertical separation between the semiconductor die and substrate.

15. The method of claim 14, wherein the plastic deformation of the bump into the interconnect pad provides displacement of the bump perpendicular to the semiconductor die while maintaining the vertical separation between the semiconductor die and substrate.

16. The method of claim 14, further including deforming the bump into the interconnect pad to reduce relative movement between the semiconductor die and substrate.

17. The method of claim 14, wherein the plastic deformation occurs along a sidewall of the bump.

18. The method of claim 14, further including forming the bump of gold, copper, or nickel.

19. The method of claim 14, further including forming a width of the interconnect pad to be less than a width of the bump.

20. The method of claim 14, further including depositing an adhesive resin between the semiconductor die and substrate.

21. A method of making a semiconductor device, comprising:
 providing a semiconductor die;
 forming an interconnect structure over the semiconductor die;
 providing a substrate including an interconnect pad; and
 bonding the interconnect structure to the interconnect pad by plastic deformation of the interconnect structure onto the interconnect pad.

22. The method of claim 21, wherein the plastic deformation of the interconnect structure onto the interconnect pad provides displacement of the interconnect structure perpendicular to the semiconductor die while maintaining vertical separation between the semiconductor die and substrate.

23. The method of claim 21, further including deforming the interconnect structure to reduce relative movement between the semiconductor die and substrate.

24. The method of claim 21, wherein the plastic deformation occurs along a sidewall of the interconnect structure.

25. The method of claim 21, further including forming the interconnect structure of gold, copper, or nickel.

26. The method of claim 21, further including providing a width of the interconnect pad less than a width of the interconnect structure.

* * * * *